United States Patent Office 3,497,356

Patented Feb. 24, 1970

3,497,356

PHOTORESIST COMPOSITION AND ELEMENT

Lawrence E. Martinson, Rochester, N.Y., assignor to Eastman Kodak Company, Rochester, N.Y., a corporation of New Jersey No Drawing. Filed July 1, 1966, Ser. No. 562,104
Int. Cl. G03c *1/94, 1/68*
U.S. Cl. 96—86 17 Claims

ABSTRACT OF THE DISCLOSURE

A photoresist composition is described which comprises a light-sensitive polymeric material and an organic acid chelating agent for copper ions. The composition is useful in the dip coating of copper surfaces without darkening of the resist composition.

This invention relates to photoresist compositions, and in particular to improvements in such compositions for use in processes involving the coating of copper.

It is well known to coat metals with light sensitive polymeric compositions for various photomechanical and photoresist purposes. One widely used coating method involves application of the photoresist solution to a metal surface by whirler coating, whereby a portion of the solution is poured onto a whirling plate to obtain uniform spread and remove the excess solution. An alternative method of application consists of spraying the resist solution onto the support material. These two methods make use of fresh portions of the resist solution for each coating produced.

Recently, the dip coating method has become increasingly employed commercially. By this method, individual sheets are dipped into rather large volumes of coating solution and the same tank of solution is used for preparing many coatings. Wherever copper sheets have comprised the support material, it has been observed, after the preparation of a number of coatings from a given volume, that there is a considerable darkening of the resist solution. This darkening is undesirable because it interferes with the exposure consistency and increases the required exposure of each subsequent coating. Sufficient darkening can occur to increase the time of exposure of coated plates by a factor of 2, 3 or even more, depending on the prior use of the solution. By the term "darkening" is meant a measurable increase in optical density, that is, the transmission of light through the solution is reduced. Some means of preventing such cumulative darkening in processes involving coatings on copper has been needed.

I have discovered that by the addition of certain acidic organic compounds this darkening of photoresist solutions in contact with copper can be eliminated or greatly diminished.

It is therefore an object of my invention to provide an improved photoresist coating. Another object is to provide a photoresist composition which will not darken with use. Another object is to provide a means for preparing light-sensitive coatings which will not vary in photographic speed. A further object is to provide a photoresist solution having improved tank life.

These objects are achieved by adding one or more of certain acidic organic compounds to the photoresist composition used for coating copper support materials.

The compounds which have the desired effect encompassed by this invention are organic acids which are capable of chelating or complexing copper ions, although the exact mechanism of the invention is not understood. These compounds are described herein as chelating agents for copper ions. It is not known why the photoresist composition becomes dark in the presence of copper nor why such darkening is eliminated in the presence of the acids of my invention.

The organic acids which are most useful are, for example, dicarboxylic acids, α-amino carboxylic acids and α-hydroxy carboxylic acids. Useful organic acids are those selected from those typical of the type described above and include, for example, dibasic acids such as malonic, succinic, adipic and sebacic; α-hydroxy acids such as malic, tartronic, tartaric and citric; and α-amino acids such as glycine, aspartic acid and alanine; and ethylenediaminetetraacetic acid. The acids which I have found particularly useful include citric, sebacic and tartaric, although others such as tartronic, malic, arabonic and tetrahydrohxyadipic are also useful.

The effect of the acids of my invention is different from the known inhibiting action of certain acids incorporated in photoresist materials. The latter serve to prevent premature polymerization of unsaturated compounds to prevent the insolubilization reaction at the surface of a zinc plate; however, such prior art addenda are ineffective in preventing the progressive darkening of the photoresist solutions used for dip-coating copper plates.

Photosensitive layers made according to my invention are prepared by incorporating an organic acid into a light sensitive polymeric composition and coating the composition onto a copper support. In general, the selection of a light sensitive polymeric composition, the solvent for its application, the support material to which it is applied, and the method of coating on the support depends upon the intended use of the resist image produced.

The advantages which accrue due to my invention pertain to resist compositions coated onto copper supports by a method which subjects a given volume of the coating composition to repeated contact with copper.

The choice of the film-forming polymeric photosensitive composition depends upon the photographic speed required, and the properties desired in the final stencil-like resist image. A wide variety of photosensitive polymeric film-forming compositions useful for making relief or stencil-like resist images can be employed in my invention. The film-forming binder polymer or resin can be a natural rubber or modified natural polymer such as rubber, shellac, gelatin or glue, or a synthetic polymer like polyvinyl alcohol, polyethylene, nylon, or styrene-butadiene copolymer, or a compatible mixture of such polymers. In such materials the photosensitivity or property of becoming insolubilized on exposure to visible or ultraviolet radiation is imparted, or brought up to a practical value by addition of photosensitizing components. These can be separate chemical compounds mixed with the film-forming polymer, as for example, potassium dichromate as used to photosensitize glue, gelatin, and shellac compositions or as the arylazides of Hepher U.S. Patent 2,848,328, issued Aug. 19, 1958, and U.S. Patent 2,852,379, issued Sept. 16, 1958, are used to photosensitize respectively, water-dispersible and organic-solvent-soluble polymers.

The acids of my invention confer excellent stability to "dip coat" light sensitive resin dopes made from ethylenically unsaturated linear polymers which are obtained by esterification of hydroxy-containing polymeric materials such as, for example, cellulose, polyvinyl alcohol, etc. with a cinnamic acid halide such as cinnamic acid, o-chloro, or m-nitro cinnamic acid chlorides as described in U.S. Patent 2,670,286. The term "ethylenically unsaturated" is intended to include all compounds which contain the moiety:

$$>C=C<$$

such as is found in cinnamic acid derivatives. Cinnamic acid esters of polyvinyl alcohol and cellulose of varying acyl content may be prepared by deacylation of substantially fully esterified cinnamic acid esters as described in the above mentioned U.S. Patent 2,670,286. Particularly useful, are the solvent-soluble esters containing from about 60 to 100 mol percent, preferably about 87 to 100 mol percent, of vinyl cinnamate.

By the term "cinnamic acid esters of polyvinyl alcohol and cellulose" I mean organic solvent-soluble esters containing from about 60 to 100 mol percent of combined cinnamyl ester groups. This includes simple as well as mixed esters, e.g. polyvinyl acetate cinnamates and cellulose acetate cinnamates, containing at least 60 mol percent cinnamoyl ester and the balance comprising a different acyl group or being unesterified or both.

A typical resist lacquer useful for forming resist images is compounded of the following materials.

| | | |
|---|---|---|
| Polyvinyl cinnamate | grams | 2.5 |
| Methyl glycol acetate | ml | 100.0 |
| Sensitizer compound | gram | 0.25 |

Solvents and solvent combinations for the coating compositions and for developing the exposed sensitive layers of the invention can be selected from those set forth in the above U.S. Patent 2,670,286.

The concentration of sensitizer compound in the coating formula depends somewhat upon the solubility in the particular solvent used, the compatibility of the sensitizer with the sensitive polymeric material and, of course, the amount of polymeric material present. When using polyvinyl cinnamate, from about 2–25%, preferably 10%, by weight, of sensitizing compound based on the weight of polyvinyl cinnamate gives particularly useful results. With certain coating thicknesses, an amount less than 2% produces measurable speed increases. The concentration of polyvinyl cinnamate in the coating formula can be varied as required by the particular conditions of coating under consideration.

The amount of carboxylic acid which may be added to the photoresist coating solution is generally limited to a rather low concentration by its solubility in the solution. This solubility can vary from one light sensitive resin composition to another, and even between batches of the same composition but seldom exceeds about 5% by weight, of the composition. A particularly useful range is about 0.1% to 5.0%. Since the protection provided by the carboxylic acid is a function of its concentration, the amount which is added to the composition is generally that calculated to be just below the saturation point. Thus, the maximum permissible amount of acid is added without precipitation.

The following examples illustrate the use and advantages of my invention.

EXAMPLE 1

A resist lacquer useful for forming resist images on copper plates is compounded of the following materials:

| | | |
|---|---|---|
| Polyvinyl cinnamate | gram | 10.0 |
| Crystal violet carbinol base | do | 0.50 |
| Xylene | ml | 80.0 |
| Toluene | ml | 80.0 |
| Isopropyl alcohol | ml | 40.0 |

If desirable, the solvents in the above formula can be replaced wholly by methyl glycol acetate or a mixture of this solvent together with isopropyl alcohol, xylene-chlorobenzene (3 to 1 by volume) or any of the solvents or solvent combinations disclosed in the Minsk, Van Deusen and Robertson U.S. Patent 2,670,286.

To 200 ml. of the above solution 0.3 g. per liter of benzoic acid was added and the solution was placed in a 250 ml. beaker, which I refer to as beaker A.

An equal volume of the same formulation was added to a second ml. beaker, which I shall call beaker B, but in this case the formulation contained 0.3 gram per liter of tartaric acid.

Next, 10 strips of 0.024-inch thick copper measuring ¼ by 3 inches were placed in each beaker and the beakers were allowed to stand for one week.

At the end of this time, the resin solution in beaker B had become opaque, the solution in beaker A remained essentially transparent.

In order to measure the sensitometric effect of the coloration in beaker B, a photosensitive plate was made from the solution in each beaker by the following method: the contents of each beaker were stirred, after removing the copper strips, and then poured onto a 5 by 7-inch piece of copper support. The two plates were then whirled to remove the excess solution, producing plates having the same uniform coating thickness and set aside to dry.

Each plate was then exposed under a continuous tone step tablet at 4 feet from a 35-ampere white flame carbon arc for about 1 minute and developed by washing in a tray of benzene with gentle agitation for 2 minutes. The sensitometric results are as follows:

| Sample: | No. of visible steps |
|---|---|
| Plate A (contains no tartaric acid) | 2 |
| Plate B (contains 0.3 gram per liter of tartaric acid) | 6 |

Since each step in the tablet represents an exposure change of 0.15 log E, the 4-step difference represents 0.60 log E which means plate B was 4 times faster than plate A.

The concentration of tartaric acid (0.3 gram per liter) was chosen to be very close to the saturation point for this acid in the solution of resin because the protection provided by the compound is a function of its concentration.

EXAMPLE 2

The following composition is prepared:

| | | |
|---|---|---|
| Polyvinyl cinnamate | grams | 12.5 |
| 1,2-benzanthraquinone | do | 1.25 |
| Hydroquinone | do | 0.10 |
| Benzoic acid | do | 0.5 |
| Xylene | ml | 375.0 |
| Methyl glycol acetate | ml | 125.0 |

The 500 ml. of solution is divided into two 250 ml. portions which I shall refer to as beaker A and beaker B. A solution of 0.3 gram per liter of tartaric acid is added to beaker B. Subsequent steps were carried out in the same manner as in Example 1.

The sensitometric results were as follows:

| Sample: | No. of visible steps |
|---|---|
| Plate A (contains no tartaric acid) | 3 |
| Plate B (contains 0.3 gram per liter of tartaric acid) | 6 |

The 3-step difference represents 0.45 log E indicating plate B is 3 times faster than plate A.

EXAMPLE 3

Another comparison was made using the same procedure followed in Example 2 except that sebacic acid was substituted for tartaric acid. Sebacic acid was present in the resist solution at a concentration of 0.25 gram per liter.

It was observed that only slight color was apparent in the formulation containing sebacic acid after 7 days, whereas the control formulation was considerably darkened. A speed test carried out using a step tablet as described in the previous example showed the following:

| | No. of steps |
|---|---|
| (A) Control | 2 |
| (B) Formulation with sebacic acid | 4 |

Thus, after 1 week the solution containing the sebacic acid was 2 times as sensitive to light as the control.

Similar results were found using ascorbic and citric acids.

EXAMPLE 4

A photosensitive composition containing a non-light sensitive film forming resin in addition to the light sensitive resin is formulated as described below. In certain applications, it has been found desirable to improve the film adhesion characteristics of photoresists by the addition of separate film formers. Suitable thermoplastic resins include phenol-formaldehyde resins which are commercially available from many sources such as Rohm and Haas, Schenectady Chemical Corporation, Union Carbide, Allied Chemical, General Electric Company and others.

| | | |
|---|---|---|
| Polyvinyl cinnamate | grams | 20.8 |
| 2-benzoylmethylene-1-methylnaphthothiazoline | do | 0.2 |
| Hydroquinone | do | 0.1 |
| Monochlorobenzene | cc | 160.00 |
| Cyclohexanone | cc | 50.00 |
| Thermoplastic novolac resin (Durite S–3937, Borden Co.) | grams | 1.6 |

This composition is placed in a 250 ml. beaker designated beaker A. An equal amount of this composition is placed in a second beaker, beaker B, to which is added 0.25 gram per liter of tartaric acid. Subsequent steps are carried out in the same manner as in Example 1.

The sensitometric results are as follows:

| | No. of visible steps |
|---|---|
| Plate A (no tartaric acid) | 2 |
| Plate B (0.25 gram per liter of tartaric acid) | 5 |

A 3-step difference is equal to 0.45 log E. This indicates speed loss of a factor of 3 between the two coating solutions.

EXAMPLE 5

An aryl azide sensitized cyclized rubber photoresist coating for copper plates was prepared in the following way according to the manner described in U.S. Patent 2,852,379. A solution was prepared to contain:

| | Parts |
|---|---|
| Cyclized rubber | 30.0 |
| Chlorinated rubber (Alloprene B, I.C.I.) | 10.0 |
| Trichloroethylene | 100.0 |
| 4,4′-diazidochalcone | 1.0 |

This light sensitive mixture was used in a dip tank for coating sheets of copper with a thin layer of the resist. After the sheets were withdrawn from the tank and dried, they were exposed in contact with a line transparency to mercury vapor illumination in the known manner. The exposure was 3 minutes at 18 inches from two 400-watt high pressure mercury vapor tubes (for example, OSIRA lamps by General Electric). The exposed plates were placed in a tank containing trichloroethylene and agitated freely for approximately 2 minutes whereupon the unexposed rubber was removed. The remaining image was washed under running water and dried.

It was observed that after about 20 square feet of copper surface are coated in a gallon of resist solution, the remaining solution has become dark, and it is necessary to increase the exposure to 6 minutes to obtain satisfactory insolubilization of the photoresist.

The addition of 1.0 gram of tartaric acid to 1 liter of resist solution prevents such darkening of the solution and there is no change required in the exposure time of the coated copper plates, even after 50 square feet of copper have been coated using the same tank of photoresist material.

EXAMPLE 6

Similar results to those described in Example 5 were obtained by the use of citric acid.

The invention has been described in detail with particular reference to preferred embodiments thereof, but it will be understood that variations and modifications can be effected within the spirit and scope of the invention as described hereinabove and as defined in the appended claims.

What is claimed is:

1. A photosensitive polymeric coating composition comprising (1) an organic solvent soluble, light-sensitive, film-forming polymeric material selected from the group consisting of (a) aryl azide sensitized rubber materials, and (b) cinnamic acid esters of hydroxyl containing linear polymers and (2) an organic acid chelating agent for copper ions in sufficient amount to prevent darkening of the coating composition in contact with a copper surface.

2. A photosensitive polymeric coating composition as defined in claim 1 wherein the organic acid chelating agent for copper ions is selected from the group consisting of dicarboxylic acids, α-hydroxy carboxylic acids and α-amino carboxylic acids.

3. A photosensitive polymeric coating composition as defined in claim 2 wherein the organic acid chelating agent for copper ions constitutes from about 0.1 to 5 percent by weight of the coating composition.

4. A photosensitve polymeric coating composition as defined in claim 3 wherein the light-sensitive, film-forming polymeric material is a polyvinyl cinnamate.

5. A photosensitive polymeric coating composition as defined in claim 3 wherein the light-sensitive, film-forming polymeric material is an aryl azide sensitized natural rubber.

6. A photosensitive polymeric coating composition as defined in claim 3 wherein the light-sensitive, film-forming polymeric material is an aryl azide sensitized synthetic rubber.

7. A photosensitive polymeric coating composition as defined in claim 3 wherein the light-sensitive, film-forming polymeric material is an aryl azide sensitized cyclized rubber.

8. A photosensitive polymeric coating composition as defined in claim 4 wherein the organic acid chelating agent for copper ions is selected from the group consisting of tartaric acid, sebacic acid and citric acid.

9. A photosensitive polymeric coating composition comprising polyvinyl cinnamate and as a chelating agent for copper ions, tartaric acid present in amount of about from 0.1 to 5 percent by weight of the coating composition.

10. A photosensitive polymeric coating composition comprising an aryl azide sensitized, cyclized rubber and as a chelating agent for copper ions, tartaric acid present in amount of about from 0.1 to 5 percent by weight of the coating composition.

11. A photosensitive element comprising a support on which is coated a layer of a polymeric composition comprising:

(1) an organic solvent soluble, light-sensitive, film-forming polymeric material selected from the group consisting of (a) aryl azide sensitized rubber materials, and (b) cinnamic acid esters of hydroxyl containing linear polymers and (2) an organic acid chelating agent for copper ions in sufficient amount to prevent darkening of the coating composition in the contact with a copper surface.

12. A photosensitive element as defined in claim 11 wherein the support is a copper support and the organic acid chelating agent for copper ions is selected from the group consisting of dicarboxylic acids, α-hydroxy carboxylic acids and α-amino carboxylic acids.

13. A photosensitive element as defined in claim 12 wherein the light-sensitive, film-forming polymeric material is a polyvinyl cinnamate.

14. A photosensitive element as defined in claim 12 wherein the light-sensitive, film-forming polymeric material is selected from the group consisting of aryl azide sensitized natural rubbers, aryl azide sensitized synthetic rubbers and aryl azide sensitized cyclized rubbers.

15. A photosensitive element as defined in claim 13 wherein the organic acid chelating agent for copper ions is selected from the group consisting of tartaric acid, sebacic acid and citric acid.

16. A photosensitive element comprising a copper support on which is coated a layer of a photosensitive polymeric composition comprising polyvinyl cinnamate and as a chelating agent for copper ions, tartaric acid.

17. A photosensitive element comprising a copper support on which is coated a layer of a photosensitive polymeric composition comprising an aryl azide sensitized cyclized rubber and as a chelating agent for copper ions, tartaric acid.

References Cited

UNITED STATES PATENTS

| | | | |
|---|---|---|---|
| 2,670,286 | 2/1954 | Minsk et al. | 96—115 |
| 2,852,379 | 9/1958 | Hepher et al. | 96—91 |
| 2,691,584 | 10/1954 | Smith et al. | 96—115 |

RONALD H. SMITH, Primary Examiner

U.S. Cl. X.R.

96—91, 115